United States Patent
Read et al.

(10) Patent No.: US 9,653,409 B2
(45) Date of Patent: May 16, 2017

(54) SEMICONDUCTOR PACKAGE HAVING A METAL PAINT LAYER

(71) Applicant: Skyworks Solutions, Inc., Woburn, MA (US)

(72) Inventors: Matthew Sean Read, Rancho Santa Margarita, CA (US); Hoang Mong Nguyen, Fountain Valley, CA (US); Anthony James LoBianco, Irvine, CA (US); Howard E. Chen, Anaheim, CA (US); Dinhphuoc Vu Hoang, Anaheim, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/975,473

(22) Filed: Dec. 18, 2015

(65) Prior Publication Data

US 2016/0181206 A1    Jun. 23, 2016

Related U.S. Application Data

(63) Continuation of application No. 13/904,566, filed on May 29, 2013, now Pat. No. 9,252,107.
(Continued)

(51) Int. Cl.
*H01Q 1/38* (2006.01)
*H01L 23/552* (2006.01)
(Continued)

(52) U.S. Cl.
CPC .......... *H01L 23/552* (2013.01); *H01L 21/563* (2013.01); *H01L 21/565* (2013.01);
(Continued)

(58) Field of Classification Search
CPC ...... H01L 23/552; H01L 21/565; H01Q 1/526
(Continued)

(56) References Cited

U.S. PATENT DOCUMENTS

| 8,502,735 B1 | 8/2013 | Moosbrugger et al. |
| 2006/0028378 A1 | 2/2006 | Gaucher et al. |

(Continued)

FOREIGN PATENT DOCUMENTS

| KR | 10-2002-0080822 A | 10/2002 |
| KR | 2006078790 | * 7/2006 |

OTHER PUBLICATIONS

International Search Report and Written Opinion re International Application No. PCT/US2013/043164, mailed Feb. 25, 2014, in 10 pages.

*Primary Examiner* — Hoanganh Le
(74) *Attorney, Agent, or Firm* — Knobbe, Martens, Olson & Bear, LLP

(57) ABSTRACT

Disclosed are devices and methods related to a conductive paint layer configured to provide radio-frequency (RF) shielding for a packaged semiconductor module. Such a module can include a packaging substrate, one or more RF components mounted on the packaging substrate, a ground plane disposed within the packaging substrate, and a plurality of RF-shielding wirebonds disposed on the packaging substrate and electrically connected to the ground plane. The module can further include an overmold structure formed over the packaging substrate and dimensioned to substantially encapsulate the RF component(s) and the RF-shielding wirebonds. The overmold structure can define an upper surface that exposes upper portions of the RF-shielding wirebonds. The module can further include a conductive paint layer having silver flakes disposed on the upper surface of the overmold structure so that the conductive paint layer,
(Continued)

the RF-shielding wirebonds, and the ground plane form an RF-shield for the RF component(s).

20 Claims, 18 Drawing Sheets

Related U.S. Application Data

(60) Provisional application No. 61/654,004, filed on May 31, 2012.

(51) Int. Cl.
*H01L 21/56* (2006.01)
*H01L 23/00* (2006.01)
*H01L 23/66* (2006.01)
*H01Q 1/52* (2006.01)

(52) U.S. Cl.
CPC .............. *H01L 23/66* (2013.01); *H01L 24/27* (2013.01); *H01L 24/32* (2013.01); *H01L 24/97* (2013.01); *H01L 2223/6611* (2013.01); *H01L 2223/6644* (2013.01); *H01L 2223/6672* (2013.01); *H01L 2224/29139* (2013.01); *H01L 2224/29194* (2013.01); *H01L 2224/92247* (2013.01); *H01L 2224/97* (2013.01); *H01L 2924/1531* (2013.01); *H01L 2924/15192* (2013.01); *H01L 2924/181* (2013.01); *H01L 2924/182* (2013.01); *H01L 2924/19107* (2013.01); *H01Q 1/526* (2013.01)

(58) Field of Classification Search
USPC .................................. 343/700 MS, 841, 907
See application file for complete search history.

(56) References Cited

U.S. PATENT DOCUMENTS

| | | |
|---|---|---|
| 2008/0014678 A1 | 1/2008 | Howard et al. |
| 2011/0084368 A1 | 4/2011 | Hoang et al. |
| 2011/0084378 A1 | 4/2011 | Welch et al. |
| 2011/0168786 A1 | 7/2011 | Lin |
| 2013/0222196 A1 | 8/2013 | Hashimoto et al. |

* cited by examiner

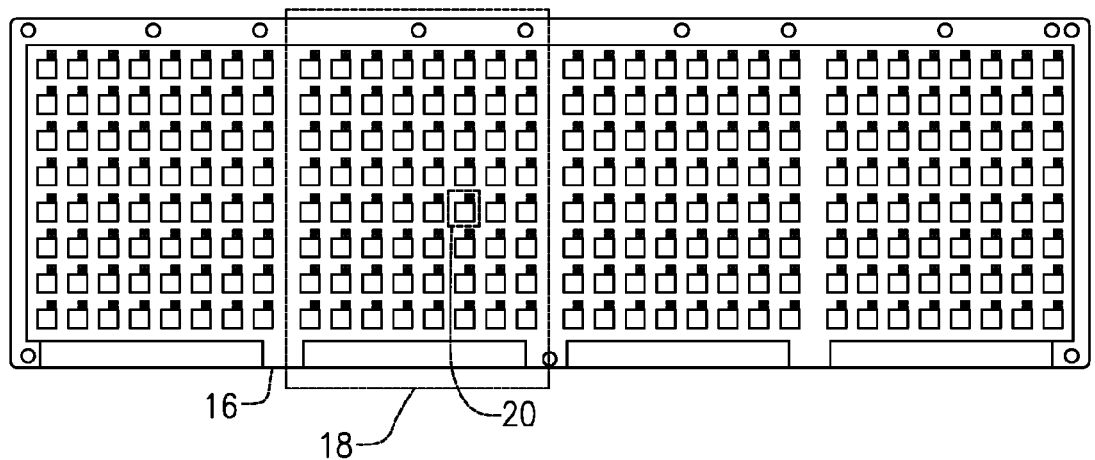
FIG.2A1
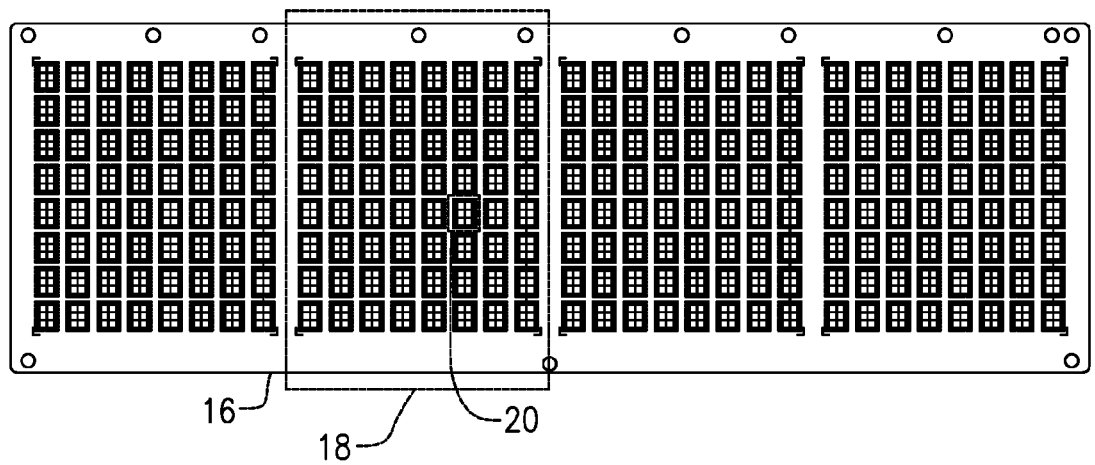
FIG.2A2

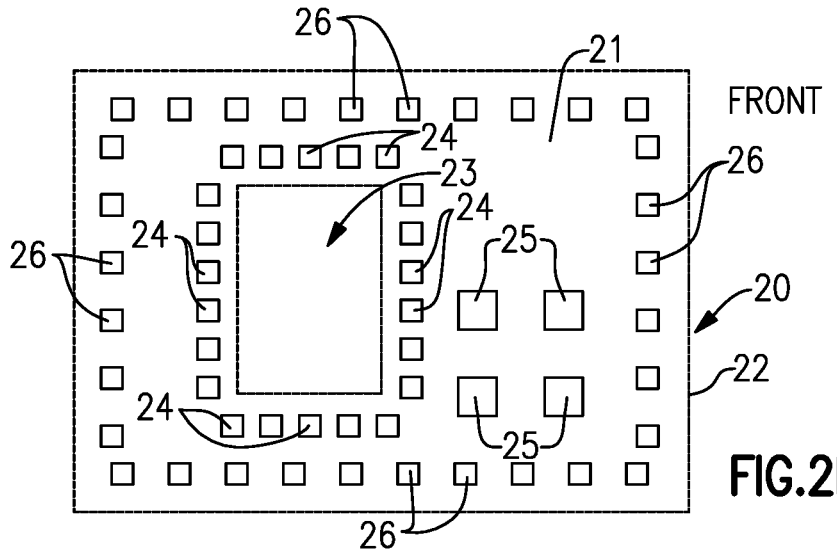
FIG.2B1
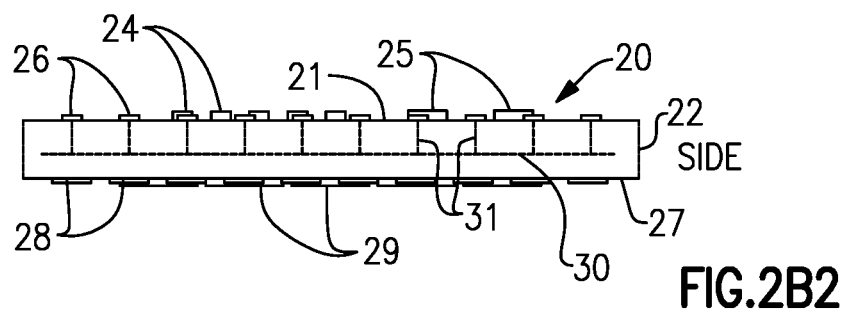
FIG.2B2
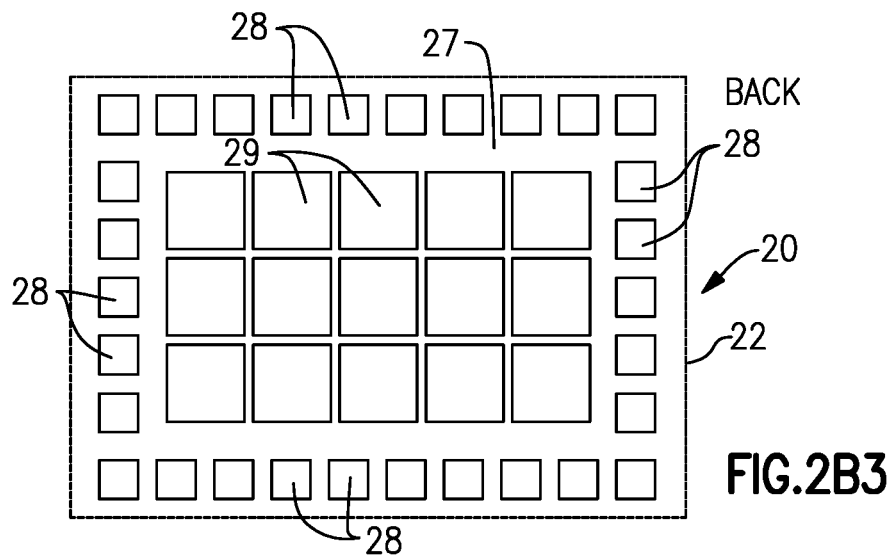
FIG.2B3

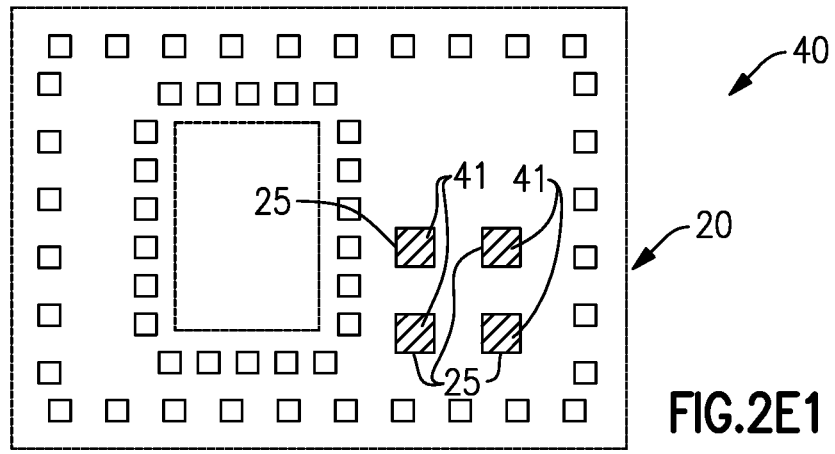
FIG.2E1
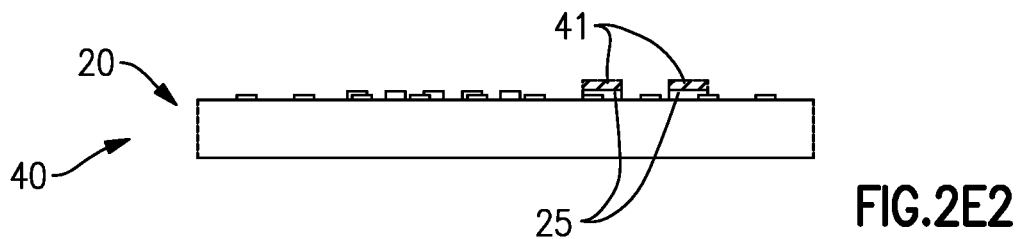
FIG.2E2
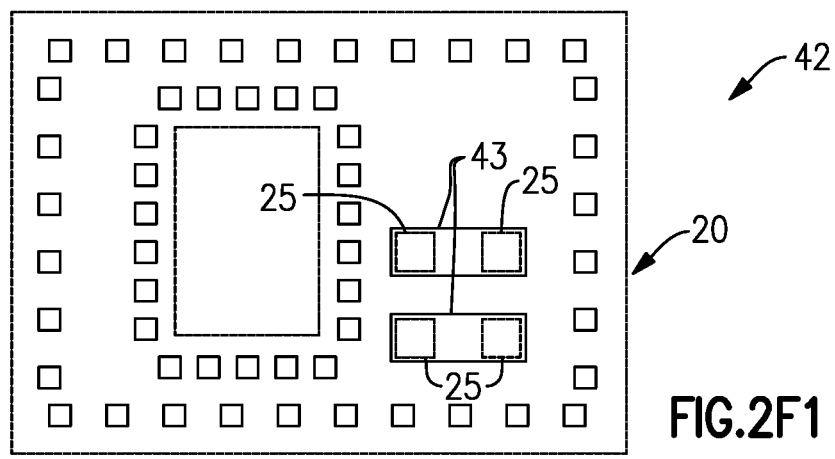
FIG.2F1
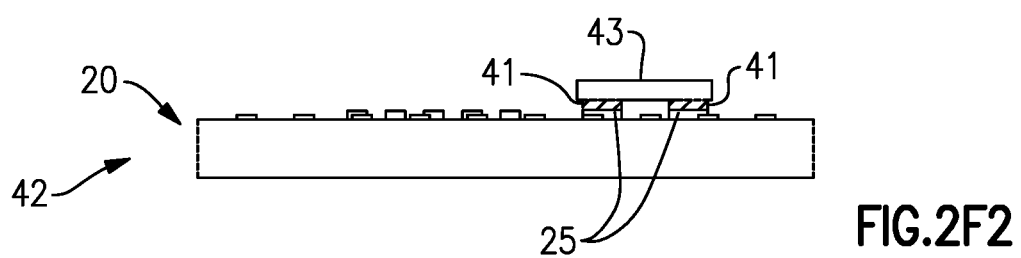
FIG.2F2

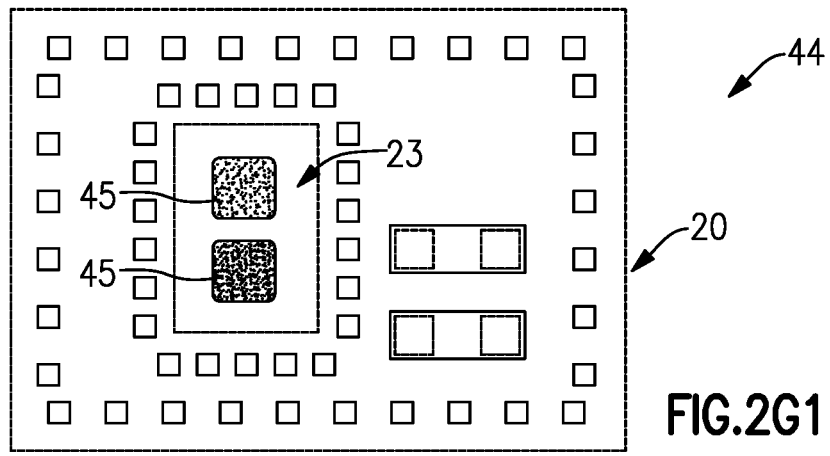
FIG.2G1
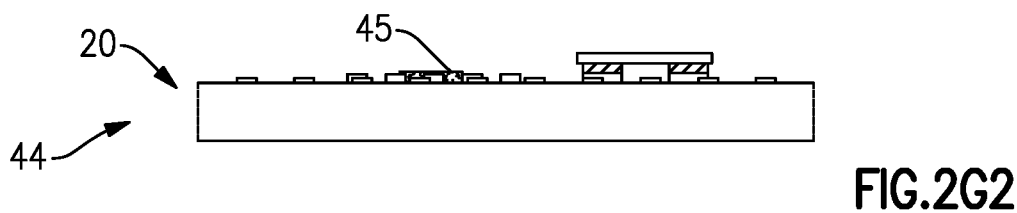
FIG.2G2
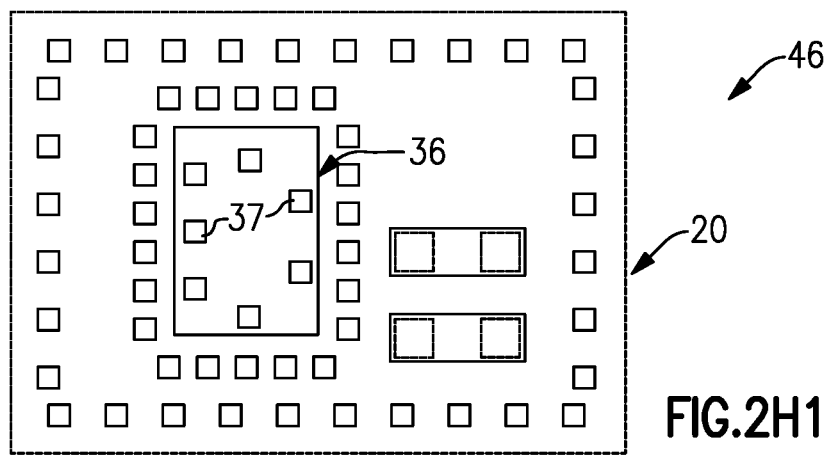
FIG.2H1
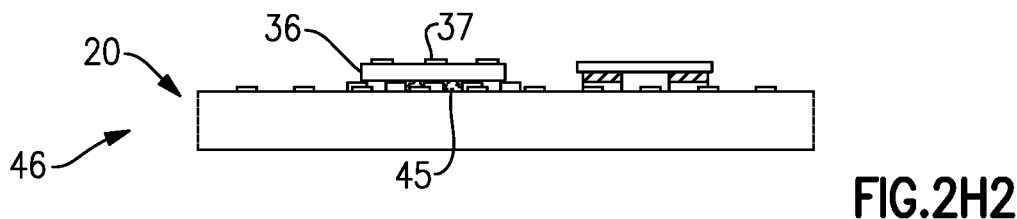
FIG.2H2

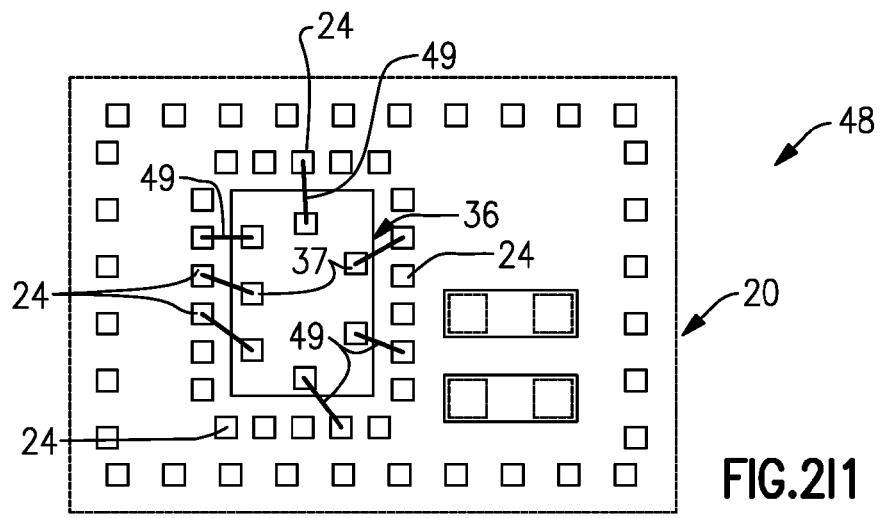
FIG. 2I1
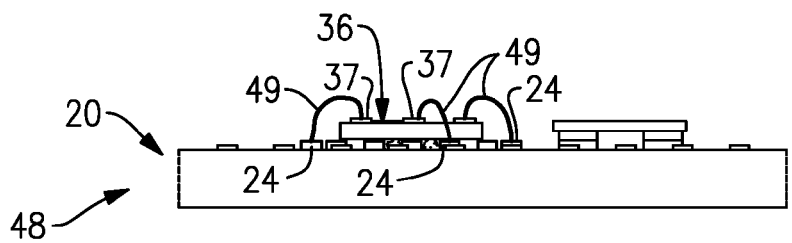
FIG. 2I2
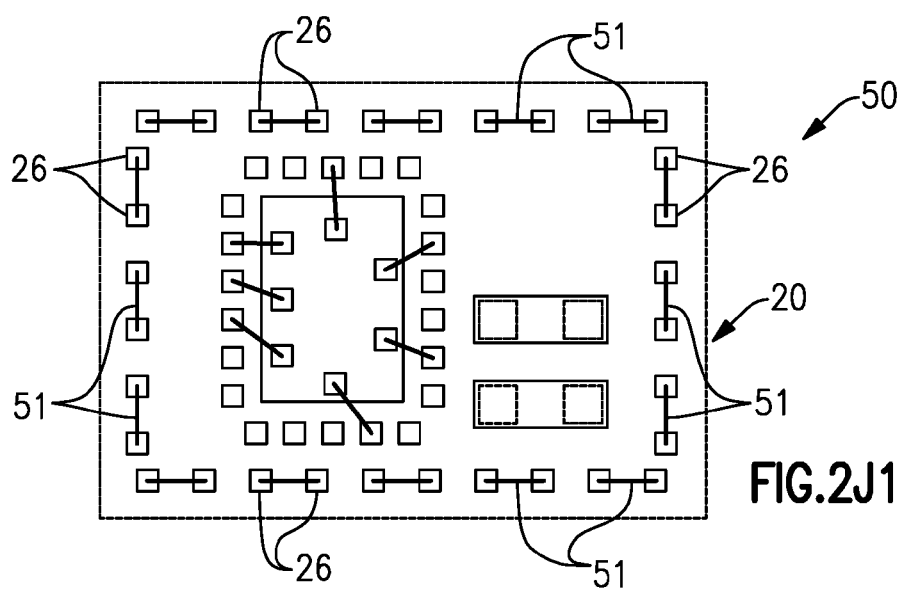
FIG. 2J1
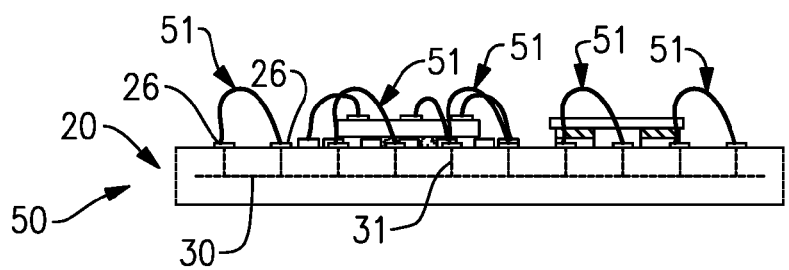
FIG. 2J2

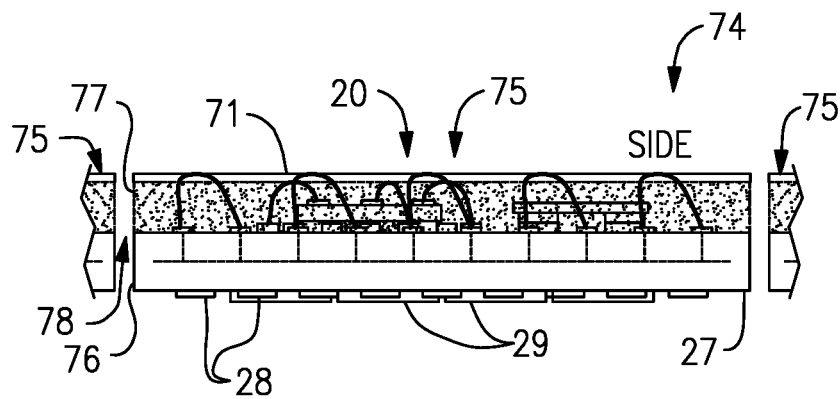
FIG.2R
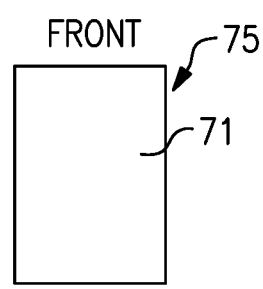
FIG.2S1
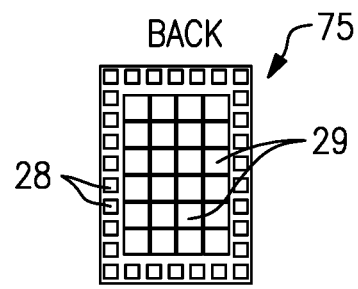
FIG.2S2
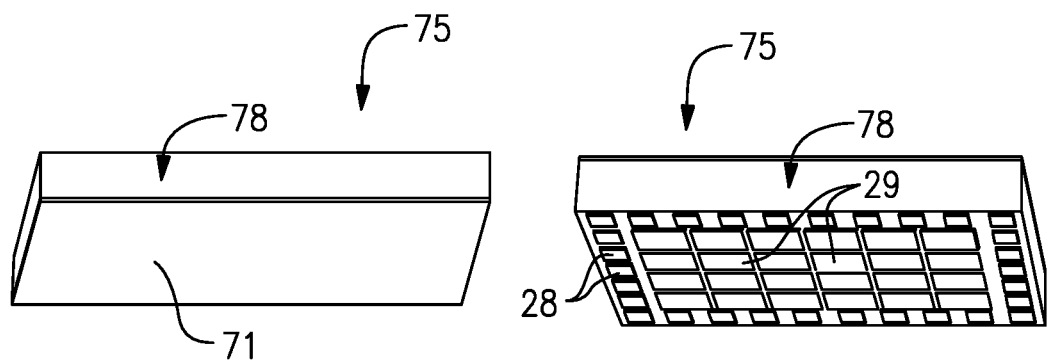
FIG.2S3

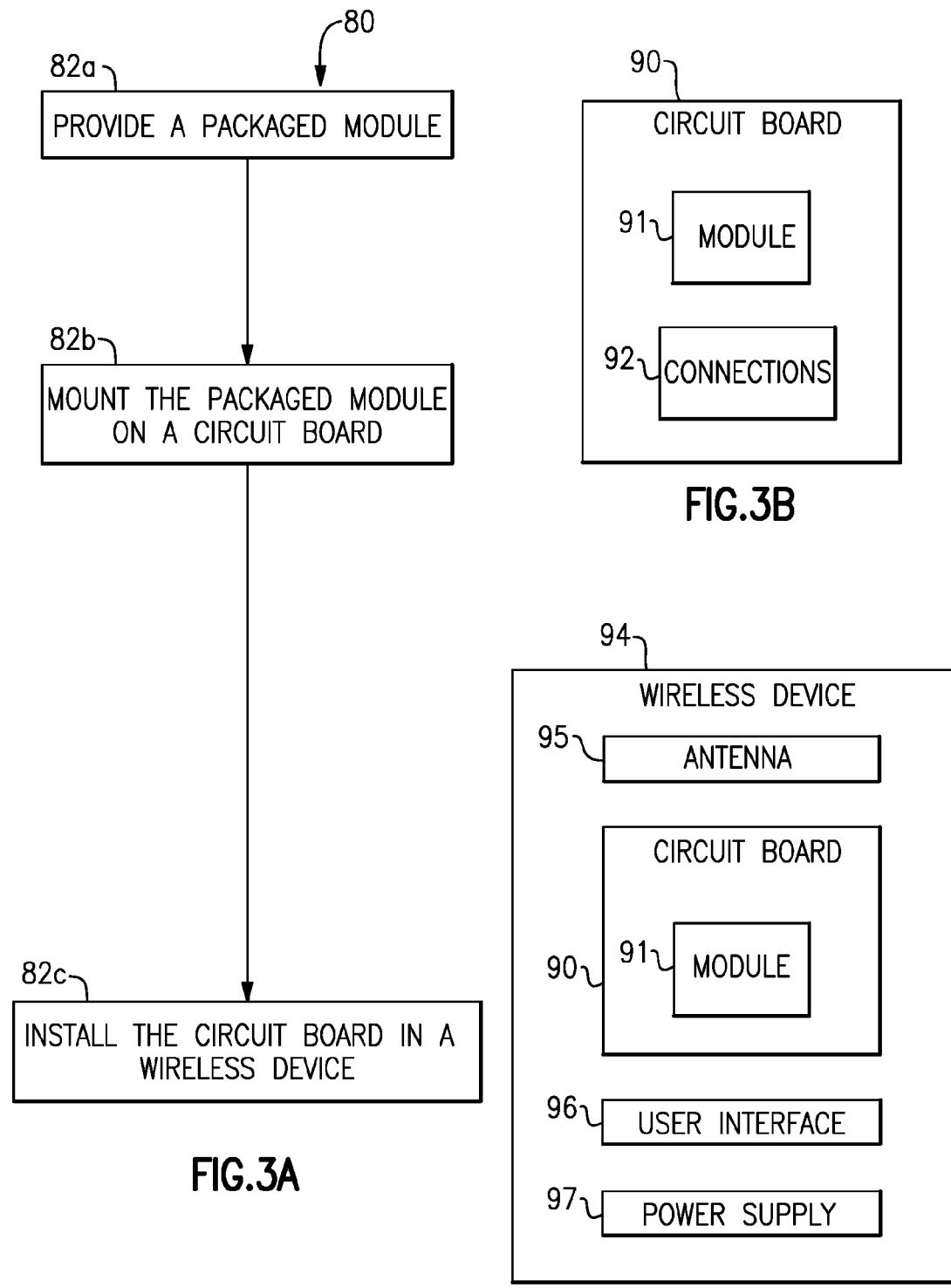

SEMICONDUCTOR PACKAGE HAVING A METAL PAINT LAYER

CROSS-REFERENCE TO RELATED APPLICATIONS

This application is a continuation application of U.S. application Ser. No. 13/904,566, filed May 29, 2013, which is a non-provisional of and claims priority to U.S. Provisional Application No. 61/654,004, filed on May 31, 2012, entitled "SEMICONDUCTOR PACKAGE HAVING A METAL PAINT LAYER," which is hereby incorporated herein by reference in its entirety.

BACKGROUND

Field

The present disclosure generally relates to radio-frequency (RF) shielding of semiconductor packages and, more particularly, to semiconductor packages having a metal paint layer.

Description of the Related Art

Devices such as integrated circuits implemented on semiconductor die are often implemented as packaged modules. A packaged module can include one or more of such die, as well as one or more passive devices.

In many radio-frequency (RF) applications, it is desirable to have a first location within such a packaged module be sufficiently isolated from a second location in terms of, for example, electromagnetic interference (EMI) disturbances and/or RF signals. Such a second location can be within or outside of the packaged module.

SUMMARY

In accordance with a number of implementations, the present disclosure relates to a radio-frequency (RF) module that includes a packaging substrate configured to receive a plurality of components. The module further includes one or more RF components mounted on a surface of the packaging substrate. The module further includes a ground plane disposed below the surface of the packaging substrate. The module further includes a plurality of shielding-components disposed relative to the one or more RF components and electrically connected to the ground plane. The module further includes an overmold structure formed over the surface of the packaging substrate and dimensioned to substantially encapsulate the one or more RF components and the shielding-components. The module further includes a conductive paint layer disposed on the upper surface of the overmold structure so that the conductive paint layer, the shielding-components, and the ground plane are electrically connected to provide RF-shielding for a region associated with the one or more RF components. The conductive paint layer includes silver flakes.

In some embodiments, the conductive paint layer can include approximately 15-30% by weight of the silver flakes, 15-25% by weight of acetone, 20-40% by weight of dimethyl carbonate, and 20-40% by weight of 1-methoxy-2-propanol acetate. In some embodiments, the conductive paint layer can be substantially free of a methyl ethyl ketone or derivatives thereof. In some embodiments, the conductive paint layer can have a thickness in a range of about 15 to 50 microns. In some embodiments, the conductive paint layer can have a thickness of about 25 microns.

In some embodiments, the conductive paint layer can include a one-part paint. In some embodiments, the silver flakes can have an average dimension in a range of about 20 to 30 microns. In some embodiments, the silver flakes can have an average dimension of about 27 microns. In some embodiments, the silver flakes can be overlapped so that the conductive paint layer forms an electrically conductive layer. In some embodiments, the conductive paint layer can define an upper surface of the module.

In some embodiments, the plurality of shielding-components can include a plurality of shielding-wirebonds. The plurality of shielding-wirebonds can be arranged along a perimeter around the one or more RF components. The overmold structure can define an upper surface that exposes upper portions of the plurality of shielding-wirebonds.

In a number of implementations, the present disclosure relates to a method for fabricating a radio-frequency (RF) module. The method includes providing a packaging substrate configured to receive a plurality of components. The packaging substrate includes a ground plane disposed below a surface of the packaging substrate. The method further includes mounting one or more RF components on the surface of the packaging substrate. The method further includes forming or providing a plurality of shielding-components relative to the one or more RF components. The method further includes forming an overmold structure to substantially encapsulate the one or more RF components and the shielding-components. The method further includes forming a conductive paint layer on the upper surface of the overmold structure so that the conductive paint layer, the shielding components, and the ground plane are electrically connected to provide RF-shielding for a region associated with the one or more RF components. The conductive paint layer includes silver flakes.

In some implementations, the conductive paint layer can be formed at or near room temperature and without irradiation. The conductive paint can be a one-part paint. The forming of the conductive paint layer can include spraying a conductive paint. The spraying can be performed using a spray pressure of about 2 psi.

According to some implementations, the present disclosure relates to a radio-frequency (RF) device that includes a transceiver configured to process RF signals. The RF device further includes an antenna in communication with the transceiver and configured to facilitate transmission of an amplified RF signal and reception of a received signal. The RF device further includes an RF module interconnected to the transceiver and the antenna to facilitate the transmission of the amplified RF signal or the reception of the received signal. The RF module includes a shielded region defined by a plurality of shielding-components that electrically connect a conductive paint layer and a ground plane. The conductive paint layer includes silver flakes. In some embodiments, the RF device can be a wireless device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 2A1 and 2A2 show front and back sides of an example laminate panel configured to receive a plurality of die for formation of packaged modules.

FIGS. 2B1 to 2B3 show various views of a laminate substrate of the panel configured to yield an individual module.

FIGS. 2E1 and 2E2 show various views of the laminate substrate being prepared for mounting of example surface-mount technology (SMT) devices.

FIGS. 2F1 and 2F2 show various views of the example SMT devices mounted on the laminate substrate.

FIGS. 2G1 and 2G2 show various views of the laminate substrate being prepared for mounting of an example die.

FIGS. 2H1 and 2H2 show various views of the example die mounted on the laminate substrate.

FIGS. 2I1 and 2I2 show various views of the die electrically connected to the laminate substrate by example wirebonds.

FIGS. 2J1 and 2J2 show various views of wirebonds formed on the laminate substrate and configured to facilitate electromagnetic (EM) isolation between an area defined by the wirebonds and areas outside of the wirebonds.

FIG. 2R shows individual packaged modules being cut from the panel.

FIGS. 2S1 to 2S3 show various views of an individual packaged module.

FIG. 3A shows a process that can be implemented to install a packaged module having one or more features as described herein on a circuit board such as the phone board of FIG. 2T.

FIG. 3B schematically depicts the circuit board with the packaged module installed thereon.

FIG. 3C schematically depicts a wireless device having the circuit board with the packaged module installed thereon.

DETAILED DESCRIPTION OF SOME EMBODIMENTS

The headings provided herein, if any, are for convenience only and do not necessarily affect the scope or meaning of the claimed invention.

Described herein are various examples of systems, apparatus, devices structures, materials and/or methods related to fabrication of packaged modules having a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality.

Figure 1:
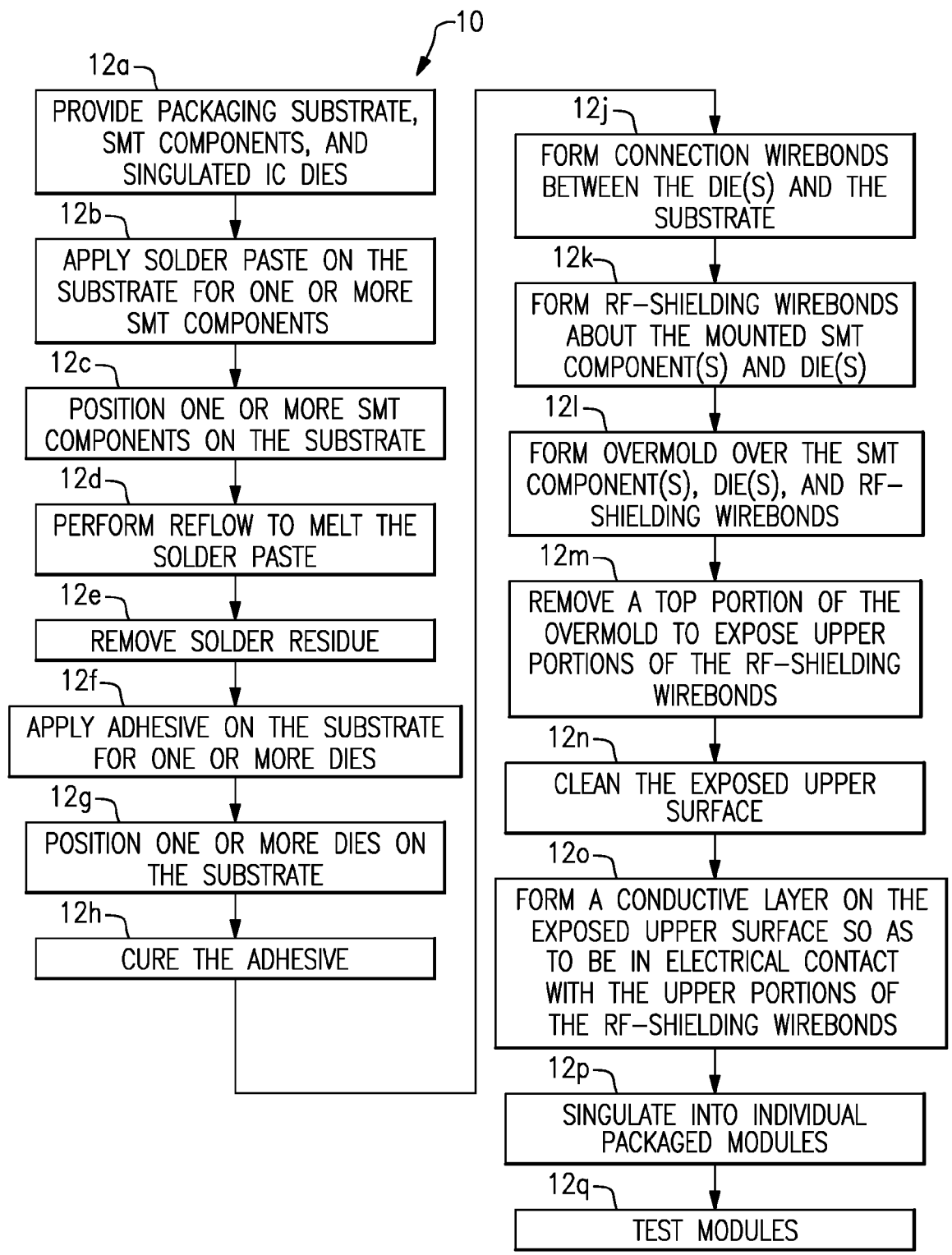
FIG. 1 shows a process that can be implemented to fabricate a packaged module that includes one or more components such as a die having an integrated circuit (IC) configured to provide radio-frequency (RF) functionality.

FIG. 1 shows a process 10 that can be implemented to fabricate a packaged module having one or more features as described herein. FIG. 2 shows various parts and/or stages of various steps associated with the process 10 of FIG. 1.

In block 12a of FIG. 1, a packaging substrate and parts to be mounted on the packaging substrate can be provided. Such parts can include, for example, one or more surface-mount technology (SMT) components and one or more singulated die having integrated circuits (ICs). For the purpose of description, it will be understood that the term "die" can include a single die or a plurality of die (sometimes also referred to as dies).

FIGS. 2A1 and 2A2 show that in some embodiments, the packaging substrate can include a laminate panel 16. FIG. 2A1 shows the example panel's front side; and FIG. 2A2 shows the panel's back side. The panel 16 can include a plurality of individual module substrates 20 arranged in groups that are sometimes referred to as cookies 18.

FIGS. 2B1-2B3 show front, side and back views, respectively, of an example configuration of the individual module substrate 20. For the purpose of description herein, a boundary 22 can define an area occupied by the module substrate 20 on the panel 16. Within the boundary 22, the module substrate 20 can include a front surface 21 and a back surface 27. Shown on the front surface 21 is an example mounting area 23 dimensioned to receive a die (not shown). A plurality of example contact pads 24 are arranged about the die-receiving area 23 so as to allow formation of electrical connections between the die and contact pads 28 arranged on the back surface 27. Although not shown, electrical connections between the wirebond contact pads 24 and the module's contact pads 28 can be configured in a number of ways. Also within the boundary 22 are two sets of example contact pads 25 configured to allow mounting of, for example passive SMT devices (not shown). The contact pads 25 can be electrically connected to some of the module's contact pads and/or ground contact pads 29 disposed on the back surface 27. Also within the boundary 22 are a plurality of wirebond pads 26 configured to allow formation of a plurality of EM-isolating wirebonds (not shown). The wirebond pads 26 can be electrically connected to an electrical reference plane (such as a ground plane) 30. Such connections between the wirebond pads 26 and the ground plane 30 (depicted as dotted lines 31) can be achieved in a number of ways. In some embodiments, the ground plane 30 may or may not be connected to the ground contact pads 29 disposed on the back surface 27.

Figure 2C:
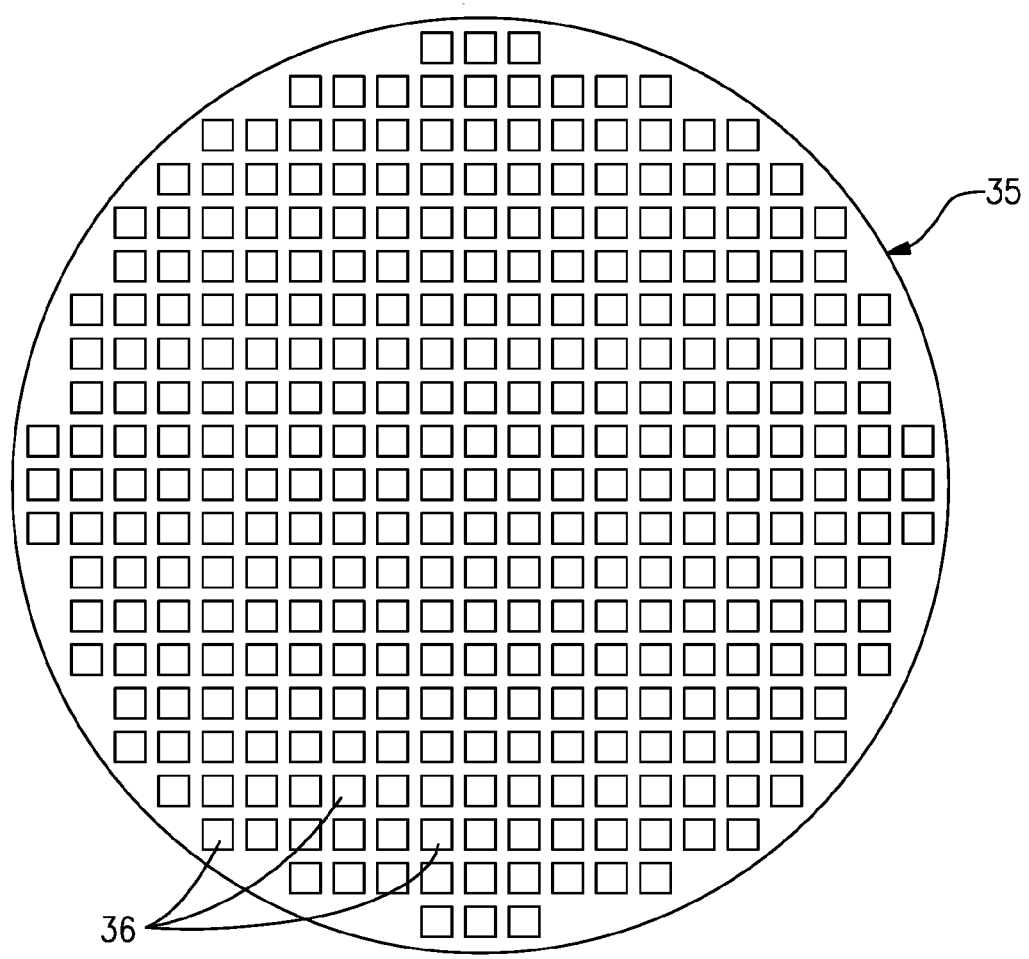
FIG. 2C shows an example of a fabricated semiconductor wafer having a plurality of die that can be singulated for mounting on the laminate substrate.
Figure 2D:
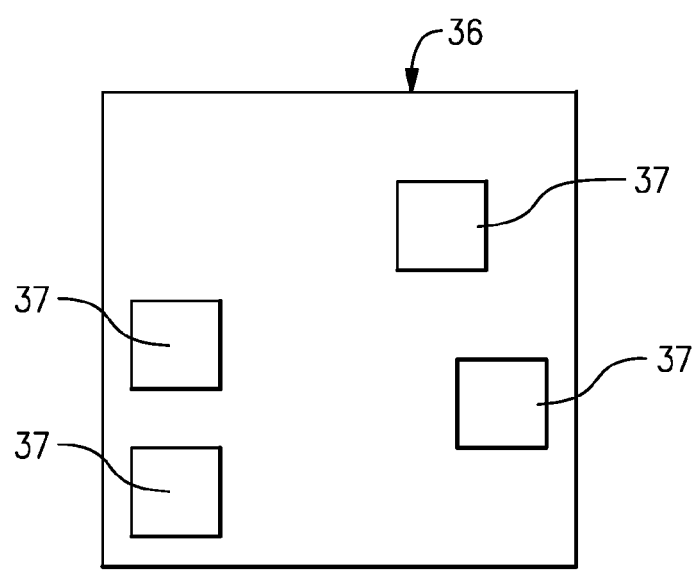
FIG. 2D depicts an individual die showing example electrical contact pads for facilitating connectivity when mounted on the laminate substrate.

FIG. 2C shows an example fabricated wafer 35 that includes a plurality of functional die 36 awaiting to be cut (or sometimes referred to as singulated) into individual die. Such cutting of the die 36 can be achieved in a number of ways. FIG. 2D schematically depicts an individual die 36 having a plurality of metalized contact pads 37. Such contact pads can be configured to allow formation of connection wirebonds between the die 36 and the contact pads 24 of the module substrate (e.g., FIG. 2B1).

In block 12b of FIG. 1, solder paste can be applied on the module substrate to allow mounting of one or more SMT devices. FIGS. 2E1 and 2E2 show an example configuration 40 where solder paste 41 is provided on each of the contact pads 25 on the front surface of the module substrate 20. In some implementations, the solder paste 41 can be applied to desired locations on the panel (e.g., 16 in FIG. 2A1) in desired amount by, for example, an SMT stencil printer.

In block 12c of FIG. 1, one or more SMT devices can be positioned on the solder contacts having solder paste. FIGS. 2F1 and 2F2 show an example configuration 42 where example SMT devices 43 are positioned on the solder paste 41 provided on each of the contact pads 25. In some implementations, the SMT devices 43 can be positioned on desired locations on the panel by an automated machine that is fed with SMT devices from tape reels.

In block 12d of FIG. 1, a reflow operation can be performed to melt the solder paste to solder the one or more SMT devices on their respective contact pads. In some implementations, the solder paste 41 can be selected and the reflow operation can be performed to melt the solder paste 41 at a first temperature to thereby allow formation of desired solder contacts between the contact pads 25 and the SMT devices 43.

In block 12e of FIG. 1, solder residue from the reflow operation of block 12d can be removed. By way of an example, a laminate panel having the module substrate 20 can be subjected to a solvent or aqueous cleaning step. Such a cleaning step can be achieved by, for example, a nozzle spray, vapor chamber, or full immersion in liquid.

In block 12f of FIG. 1, adhesive can be applied on one or more selected areas on the module substrate 20 to allow mounting of one or more die. FIGS. 2G1 and 2G2 show an example configuration 44 where adhesive 45 is applied in the die-mounting area 23. In some implementations, the adhesive 45 can be applied to desired locations on the panel (e.g., 16 in FIG. 2A1) in desired amount by techniques such as screen printing.

In block 12g of FIG. 1, one or more die can be positioned on the selected areas with adhesive applied thereon. FIGS. 2H1 and 2H2 show an example configuration 46 where an example die 36 is positioned on the die-mounting area 23 via the adhesive 45. In some implementations, the die 36 can be positioned on the die-mounting area on the panel by an automated machine that is fed with die from a tape reel.

In block 12h of FIG. 1, the adhesive between the die and the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 12j of FIG. 1, electrical connections such as wirebonds can be formed between the mounted die and corresponding contact pads on the module substrate 20. FIGS. 2I1 and 2I2 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

In block 12k of FIG. 1, a plurality of RF-shielding wirebonds can be formed about a selected area on the module substrate 20. FIGS. 2J1 and 2J2 show an example configuration 50 where a plurality of RF-shielding wirebonds 51 are formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. As described herein, a conductive layer can be formed above such an area and connected to upper portions of the RF-shielding wirebonds 51 to thereby form an RF-shielded volume.

In the example configuration 50, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired. For the purpose of description, it will be understood that RF-isolation can include keeping RF signals or noise from entering or leaving a given shielded area. In some implementations, such shielding can provide RF-isolation functionality between a first area within a module and a second area that is within and/or outside of the module.

In the example configuration 50, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVERMOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 2J1 and 2J2, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 2K:
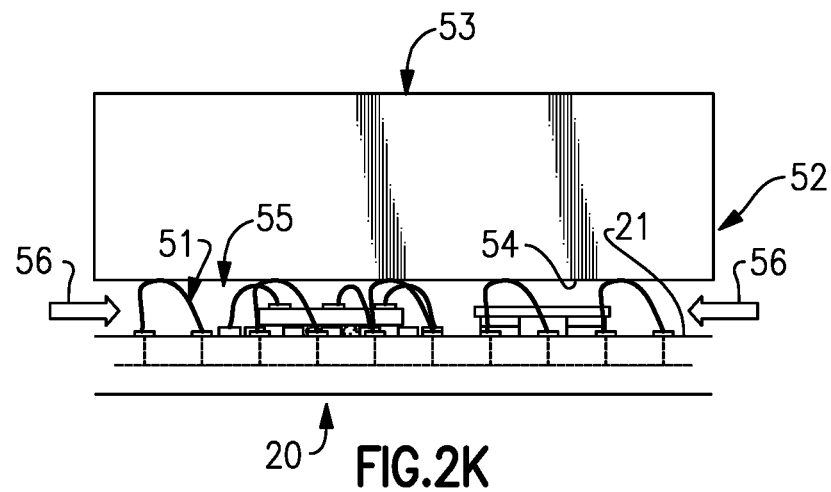
FIG. 2K shows a side view of molding configuration for introducing molding compound to a region above the laminate substrate.

In block 12*l* of FIG. 1, an overmold can be formed over the SMT component(s), die, and RF-shielding wirebonds. FIG. 2K shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 2K, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 2L:
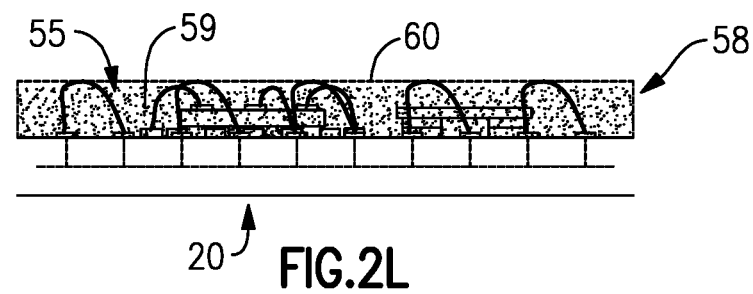
FIG. 2L shows a side view of an overmold formed via the molding configuration of FIG. 2K.

FIG. 2L shows an example configuration 58 where molding compound has been introduced into the volume 55 as described in reference to FIG. 2K and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 2M:
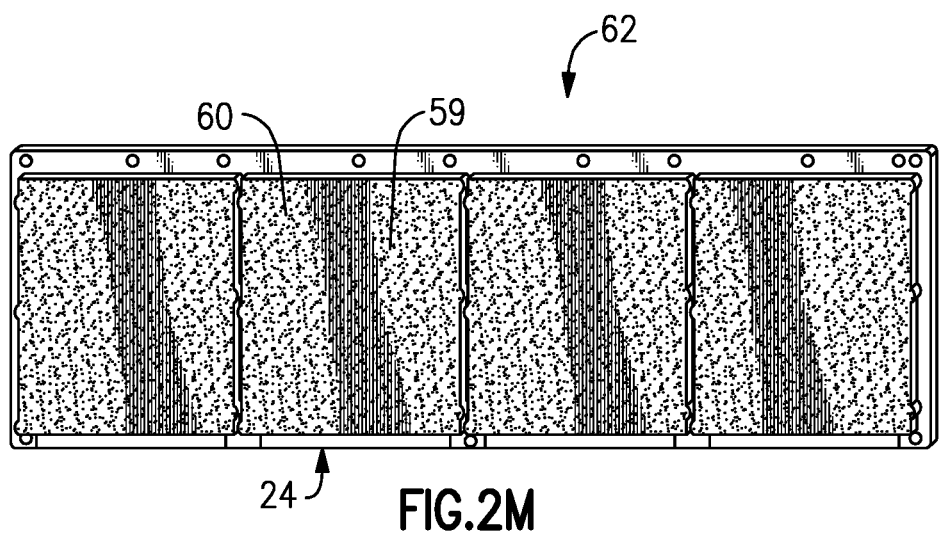
FIG. 2M shows the front side of a panel with the overmold.

FIG. 2M shows an example panel 62 that has overmold structures 59 formed over the multiple cookie sections. Each cookie section's overmold structure can be formed as described herein in reference to FIGS. 2K and 2L. The resulting overmold structure 59 is shown to define a common upper surface 60 that covers the multiple modules of a given cookie section.

The molding process described herein in reference to FIGS. 2K-2M can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

Figure 2N:
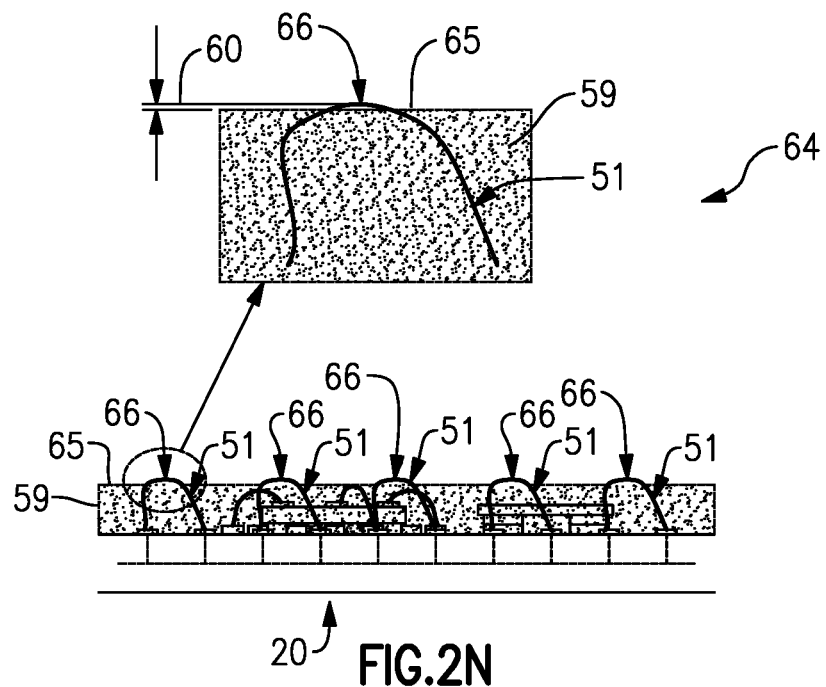
FIG. 2N shows a side view of how an upper portion of the overmold can be removed to expose upper portions of the EM isolation wirebonds.

In block 12*m* of FIG. 1, a top portion of the overmold structure can be removed to better expose upper portions of the RF-shielding wirebonds. FIG. 2N shows an example configuration 64 where such a removal has been performed. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

Figure 2O:
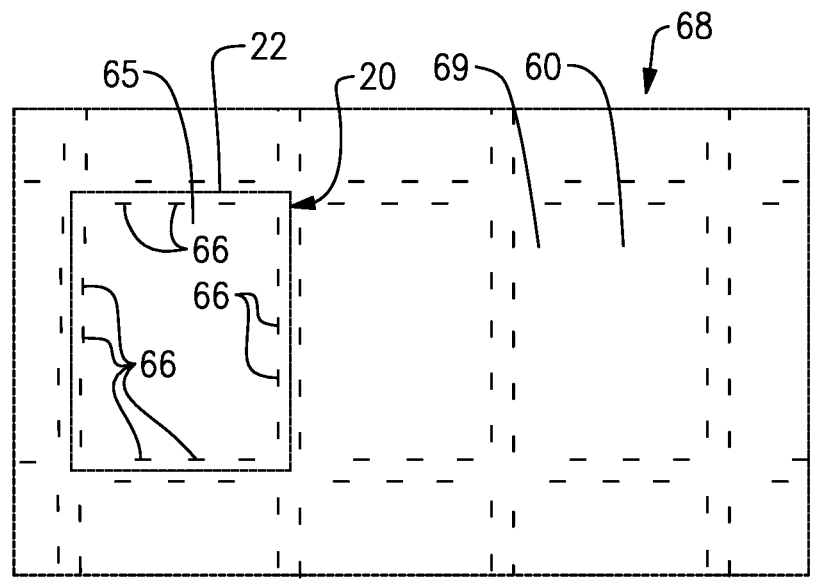
FIG. 2O shows a portion of a panel where a portion of the overmold has its upper portion removed to better expose the upper portions of the EM isolation wirebonds.

The foregoing removal of material from the upper portion of the overmold structure 59 can be achieved in a number of ways. FIG. 2O shows a plan view of an example configuration 68 where such removal of material can be achieved by sand-blasting. In the example, material can be removed to yield the new upper surface 65 and better exposed upper portions 66 of the RF-shielding wirebonds. In the example, suppose that the sand-blasting process is being performed from left to right. In such an example, a region indicated as 69 can be where the material-removal is being performed, such that the left side still has the original upper surface 60 where material has not been removed.

In the example shown in FIG. 2O, a modular structure corresponding to the underlying module substrate 20 is depicted with a dotted box 22. Such modules can be separated after a conductive layer is formed over the newly formed upper surface 65.

In block 12*n* of FIG. 1, the new exposed upper surface resulting from the removal of material can be cleaned. By way of an example, the substrates can be run through a solvent or aqueous cleaning step. Such a cleaning step can be achieved by, for example, a nozzle spray, or full immersion in liquid.

In block 12*o* of FIG. 1, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Figure 2P:
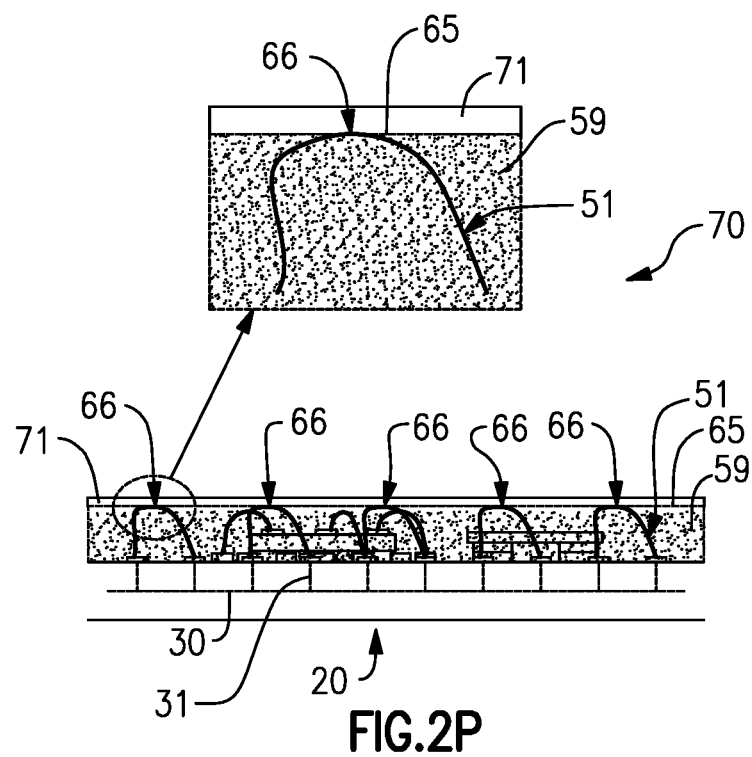
FIG. 2P shows a side view of a conductive layer formed over the overmold such that the conductive layer is in electrical contact with the exposed upper portions of the EM isolation wirebonds.

FIG. 2P shows an example configuration 70 where an electrically conductive layer 71 has been formed over the upper surface 65 of the overmold structure 59. As described herein, the upper surface 65 better exposes the upper portions 66 of the RF-shielding wirebonds 51. Accordingly, the formed conductive layer 71 forms improved contacts with the upper portions 66 of the RF-shielding wirebonds 51.

As described in reference to FIG. 2J, the RF-shielding wirebonds 51 and the ground plane 30 can yield an interconnected RF-shielding structure at sides and underside of the area defined by the RF-shielding wirebonds 51. With the upper conductive layer 71 in electrical contact with the RF-shielding wirebonds 51, the upper side above the area is now shielded as well, thereby yielding a shielded volume.

Figure 2Q:
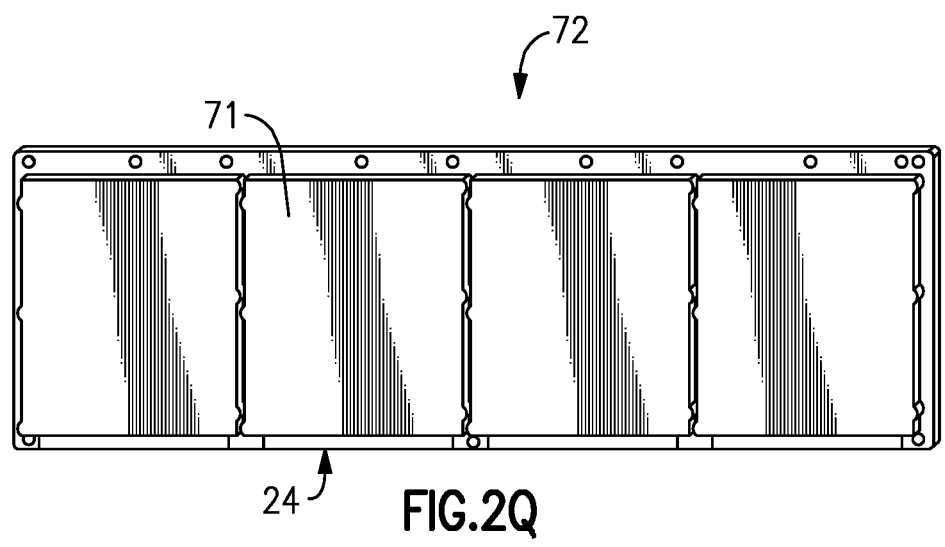
FIG. 2Q shows that in some embodiments, the conductive layer can be a spray-on metallic paint.

FIG. 2Q shows an example panel 72 that has been sprayed with conductive paint to yield an electrically conductive layer 71 that covers multiple cookie sections. As described in reference to FIG. 2M, each cookie section can include multiple modules that can be separated.

In block 12*p* of FIG. 1, the modules in a cookie section having a common conductive layer (e.g., a conductive paint layer) can be singulated into individual packaged modules. Such singulation of modules can be achieved in a number of ways, including a sawing technique.

FIG. 2R shows an example configuration 74 where the modular section 20 described herein has been singulated into a separated module 75. The overmold portion is shown to include a side wall 77; and the module substrate portion is shown to include a side wall 76. Collectively, the side walls 77 and 76 are shown to define a side wall 78 of the separated module 75. The upper portion of the separated module 75 remains covered by the conductive layer 71. As described herein in reference to FIG. 2B, the lower surface 27 of the separated module 75 includes contact pads 28, 29 to facilitate electrical connections between the module 75 and a circuit board such as a phone board.

FIGS. 2S1, 2S2 and 2S3 show front (also referred to as top herein), back (also referred to as bottom herein) and perspective views of the singulated module 75. As described herein, such a module includes RF-shielding structures encapsulated within the overmold structure; and in some implementations, the overall dimensions of the module 75 may not be significantly larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 12q of FIG. 1, the singulated modules can be tested for proper functionality. As discussed above, the modular form allows such testing to be performed easier. Further, the module's internal RF-shielding functionality allows such testing to be performed without external RF-shielding devices.

Figure 2T:
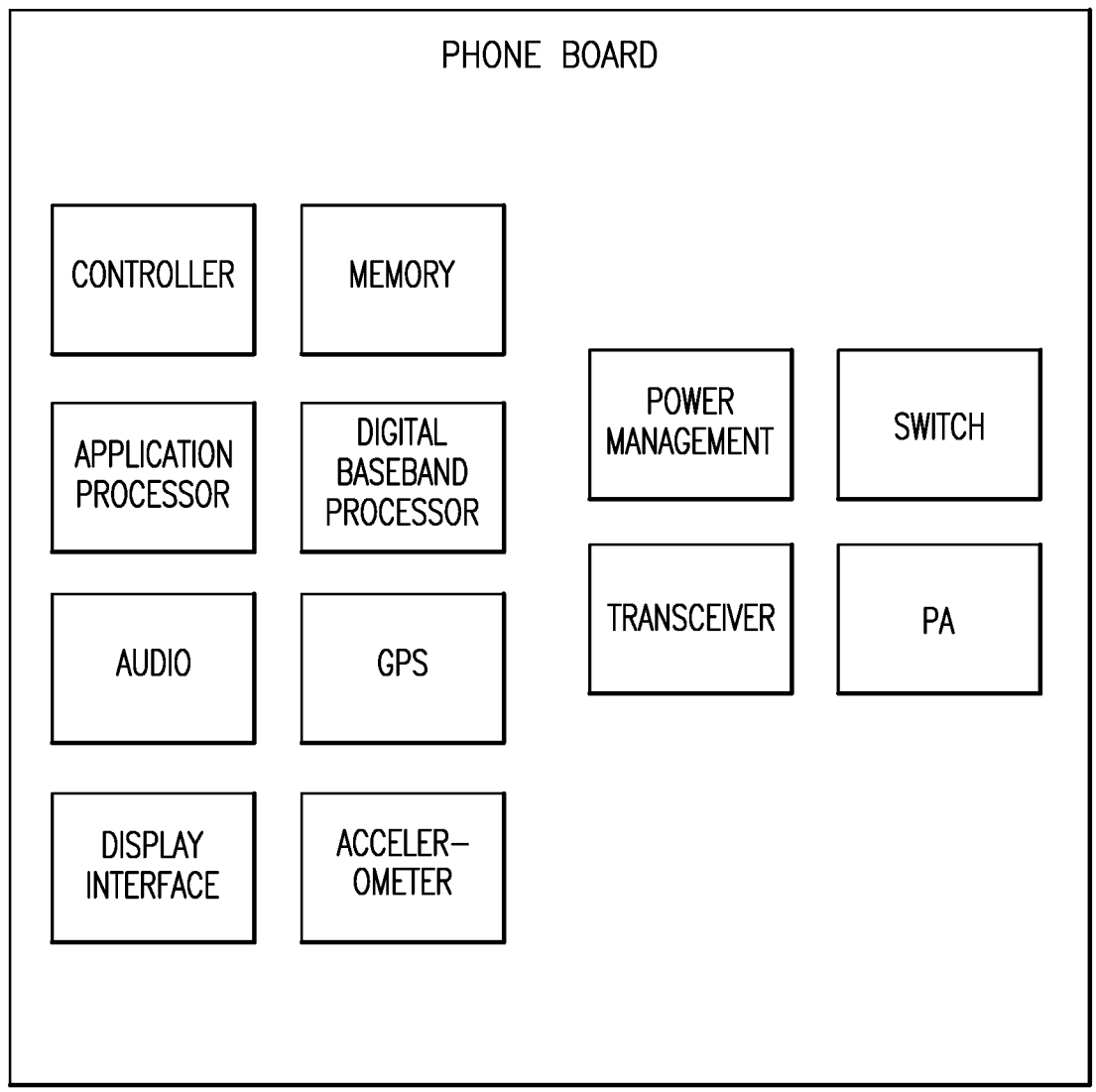
FIG. 2T shows that one or more of modules that are mounted on a wireless phone board can include one or more features as described herein.

FIG. 2T shows that in some embodiments, one or more of modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier module.

FIG. 3A shows a process 80 that can be implemented to assemble a packaged module having one or more features as described herein on a circuit board. In block 82a, a packaged module can be provided. In some embodiments, the packaged module can represent a module described in reference to FIG. 2T. In block 82b, the packaged module can be mounted on a circuit board (e.g., a phone board). FIG. 3B schematically depicts a resulting circuit board 90 having module 91 mounted thereon. The circuit board can also include other features such as a plurality of connections 92 to facilitate operations of various modules mounted thereon.

In block 82c, a circuit board having modules mounted thereon can be installed in a wireless device. FIG. 3C schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

As described herein in reference to block 12o of the example process 10 of FIG. 1 and the example configurations 70 (FIG. 2P), 72 (FIG. 2Q) and 74 (FIG. 2R), a conductive layer 71 can be formed to provide RF shielding functionality. More particularly, such a conductive layer in electrical contact with RF-shielding wirebonds 51 which in turn are in contact with a ground plane can form an RF-shielded volume. As described herein, such a conductive layer can include a conductive paint layer. Additional details concerning embodiments of such a conductive paint layer are now described.

Figure 4A:
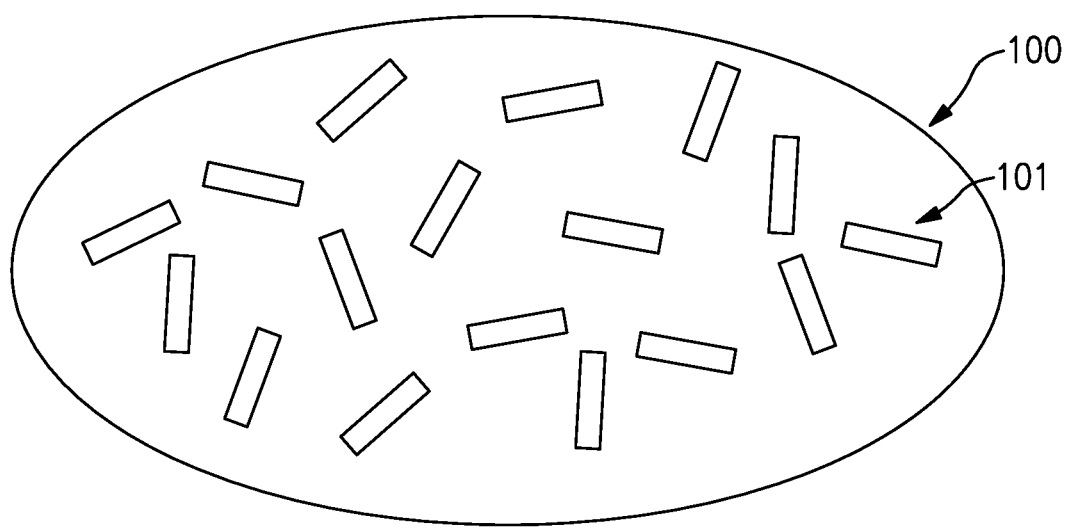
FIGS. 4A and 4B schematically depict examples of paint compositions having metal flakes such as silver flakes and configured to allow formation of the conductive layer of FIGS. 2P-2R.

Referring to FIG. 4A, a conductive paint composition 100 is shown in a fluid form. In some embodiments, the conductive paint composition 100 can contain metal flakes 101 such as silver flakes. The conductive paint composition can further contain solvents such as an organic solvent. The organic solvent can be a solvent which does not dissolve the silver flake 101, but dissolves the other compositions such as acetates, esters, catalysts, and resins. An organic solvent or a mixture thereof can have a viscosity that is desirable for handling and also for spray application. In one embodiment, the organic solvent can have a viscosity of, for example, Zahn Cup #2-22 sec. An organic solvent or a mixture thereof can have a density that is ideal or desirable for handling and also for the spray application. In one embodiment, the organic solvent can have a density in a range of, for example, 1.1 to 1.5 g/cc, or 1.2 to 1.4 g/cc. In one embodiment, the organic solvent can have a density of approximately 1.3 g/cc.

An organic solvent or a mixture thereof having a boiling point that is too low may cause the conductive paint layer to become thicker due to evaporation during processing and application, while a boiling point that is too high may cause drying or curing process to take longer or require a blowing or heating step. Thus, in one embodiment, the organic solvent can have a flash point of, for example, approximately 17° C.

Examples of the solvent can include, for example, acetone, isopropylacetone, methyl ethyl ketone, cyclohexanone, and other ketonic solvents; dimethyl carbonate, propylene carbonate, and other ester solvents; 1-methoxy-2-propanol acetate, methyl acetate, ethyl acetate, propyl acetate, butyl acetate, isobutyl acetate and other ester solvents; xylene, toluene, anisole, and other aromatic solvents; n-propanol, isopropanol, n-butanol, polyalkylene glycols and other alcoholic solvents; ethylene glycol, monomethyl ether (methyl cellosolve), diethylene glycol, diethylene glycol monoethyl ether, diethylene glycol monobutyl ether, diethylene glycol dimethyl ether, ethyleneglycol monoethylether (ethyl cellosolve), triethylene glycol monomethyl ether, polyoxyalkylene glycol derivatives (e.g., polyoxyethylene(10)octylphenyl ether) and other ethereal solvents; etc., and/or mixtures thereof. In some embodiments, a conductive paint composition having one or more features as described herein can have reduced content of, or be substantially free of methyl ethyl ketone or derivatives thereof. In some embodiments, a conductive paint layer as described herein can have reduced content of, or be substantially free of methyl ethyl ketone or derivatives thereof.

In some embodiments, the conductive layer can include a polymer structure.

In some embodiments, the silver flakes 101 can include elemental silver. In one embodiment, the silver flakes 101 can have an average size in a range of 1 to 50 microns, 10 to 40 microns, 20 to 30 microns, or 25 to 30 microns. In some embodiments, the silver flakes 101 can have an average size of about 27 microns. In some embodiments, the silver flake can include one or more mixture of elemental silver, silver oxide, silver thiocyanate, silver cyanide, silver cyanate, silver carbonate, silver nitrate, silver nitrite, silver sulfate, silver phosphate, silver perchlorate, silver tetrafluoro borate, silver acetylacetonate, silver acetate, silver lactate, silver oxalate and their derivatives and/or complexes thereof.

Figure 4B:
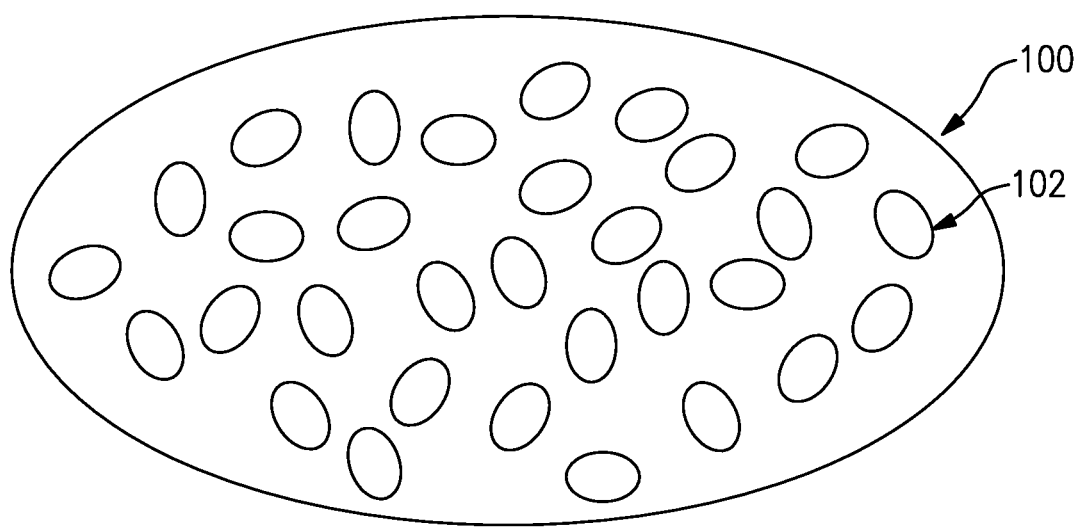

Applicant has found that a conductive paint composition 100 having one or more of the foregoing features can provide desirable conductive coating for RF-shielding applications when applied by, for example, spraying. For the purpose of description herein, the silver flakes 101 described in reference to FIG. 4A are depicted as round shaped flakes 102 (FIG. 4B). It will be understood, however, that a number of flake shapes can exist. Further, a conductive composition 100 as described herein can include silver flakes having similar or different shapes.

Silver flakes having one or more of the features described herein are depicted as forming conductive layers for packaged modules having RF-shielding features in various examples shown in FIGS. 5 and 6. It will be understood that the flakes in such examples are generally not depicted to scale, but depicted to convey how they can provide advantages in the context of, for example, RF-shielding performance, ease of mass production of modules, and cost effectiveness.

Figure 5A:
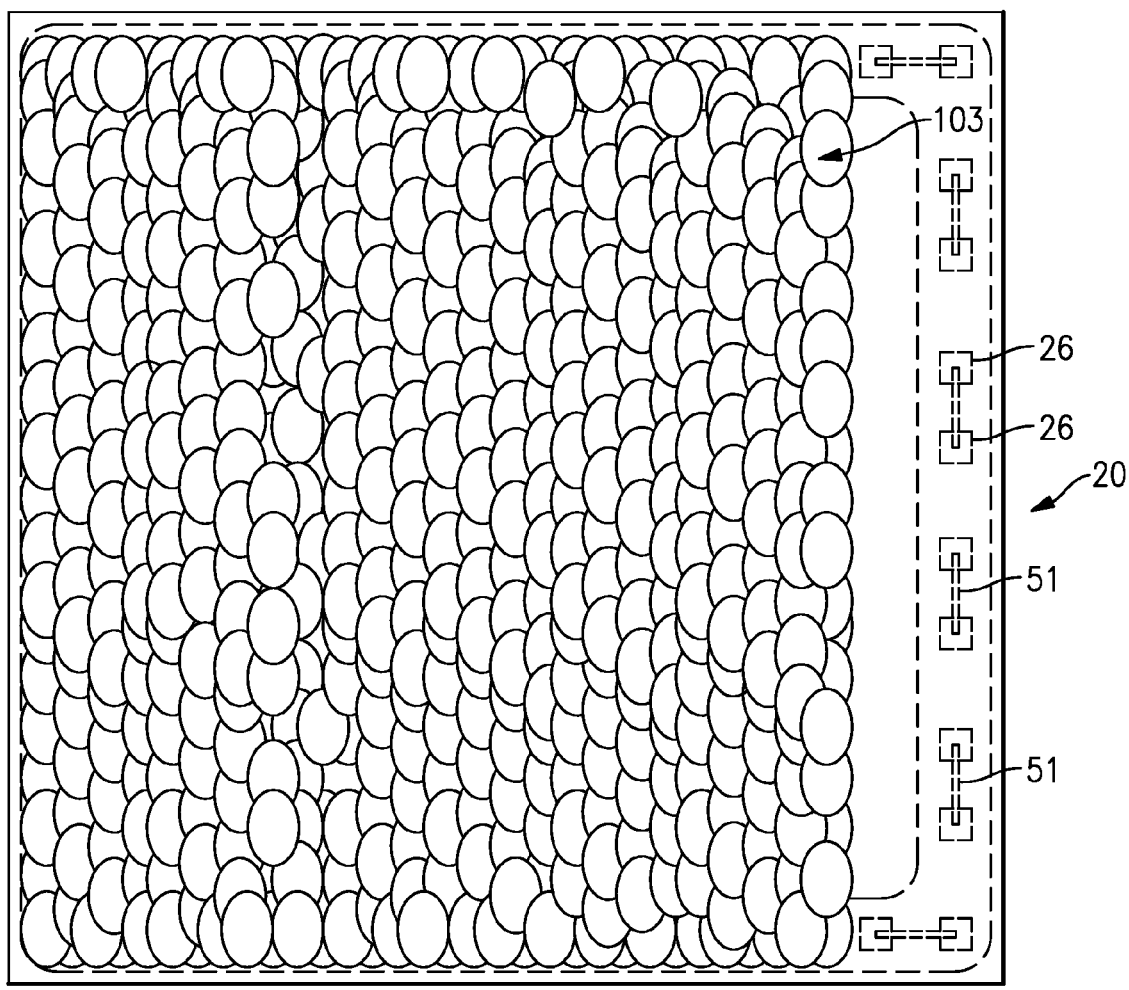
FIGS. 5A and 5B show examples of silver-flake based painted conductive layers.
Figure 5B:
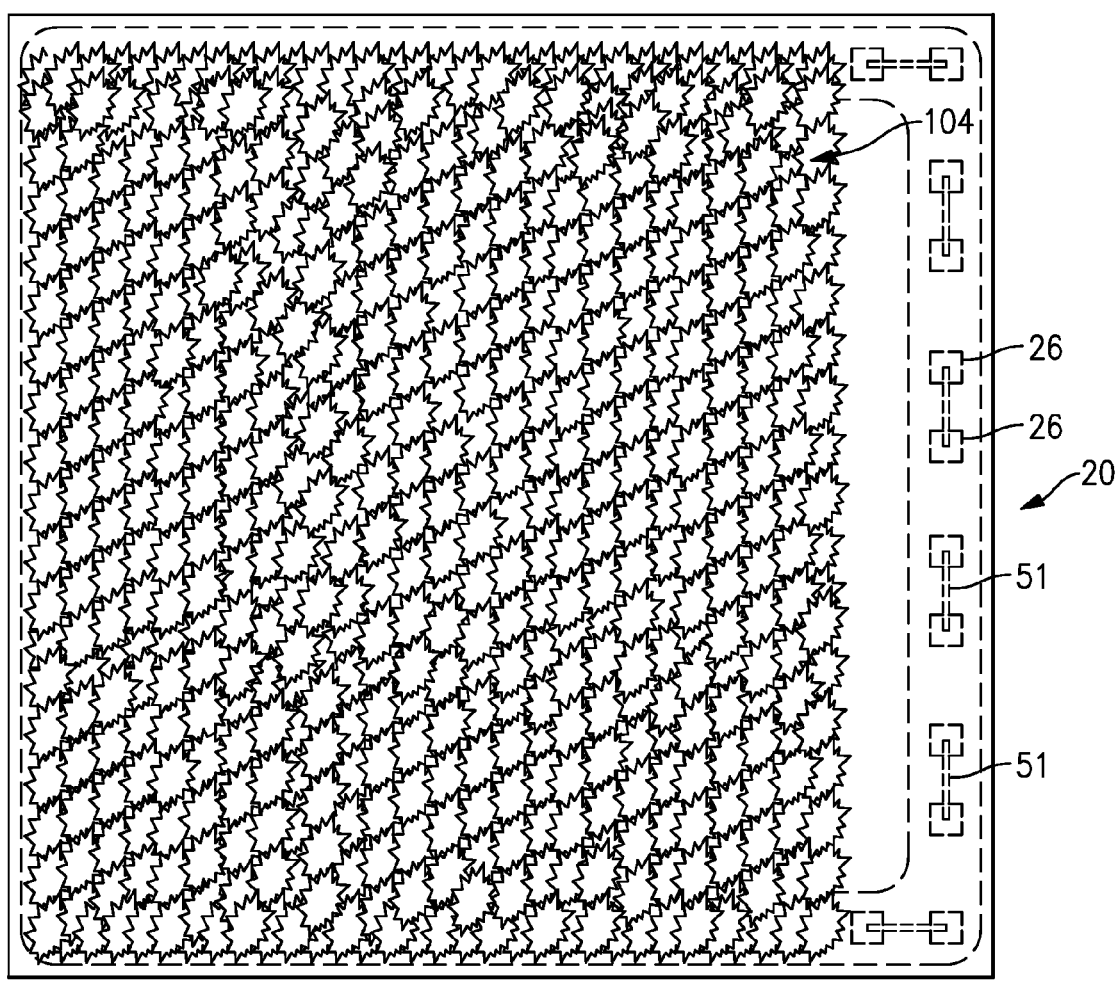

FIGS. 5A and 5B show example modules 20, each having an overmold structure thereon, and a partially-completed conductive layer 103, 104 formed thereon. The example of FIG. 5A shows round-shaped silver flakes overlapping to form an electrically conductive layer. The example of FIG. 5B shows silver flakes having edge features, again with the flakes overlapping to form an electrically conductive layer. In both examples, the conductive layers 103, 104 are shown to be completing the coverage of their respective modules 20 to electrically connect upper portions of RF-shielding wirebonds 51 as described herein to thereby electrically connect the conductive layers 103, 104 to their respective ground planes through the wirebonds 51 and contact pads 26.

In the examples of FIGS. 5A and 5B, the conductive layers 103, 104 are depicted as being applied to isolated modules 20 for clarity. It will be understood that such an application of conductive layer can be performed on a panel having an array of such modules; and the modules can be separated after the conductive layer is cured. Thus, it will be understood that overlapping of the conductive layers 103, 104 can extend between neighboring modules that have not been separated.

Figure 6A:
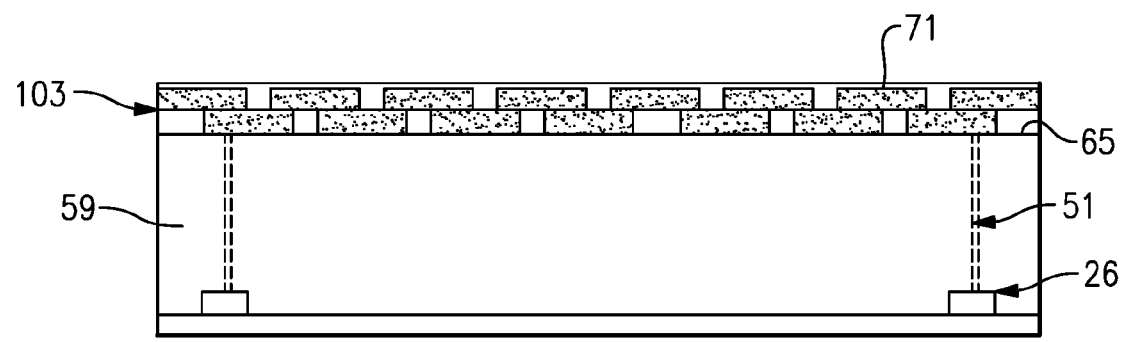
FIGS. 6A-6C show side views of the silver-flake based conductive layers.
Figure 6B:
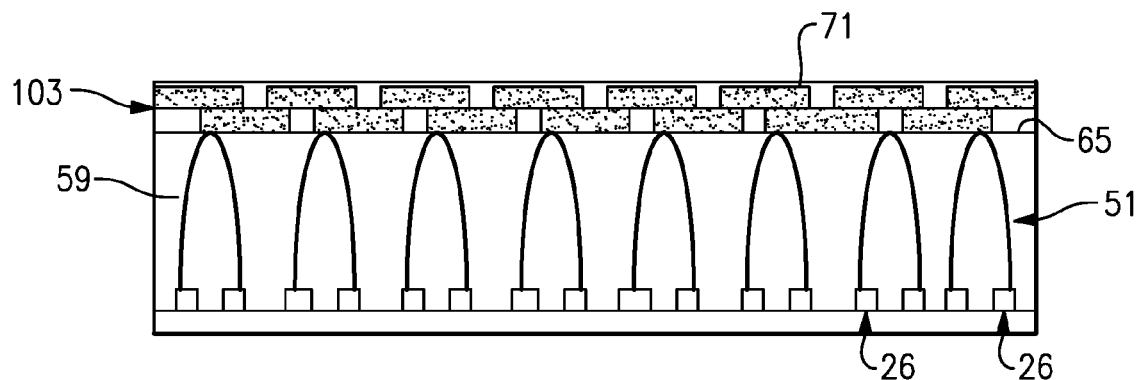

FIGS. 6A and 6B show side sectional views of the example modules of FIGS. 5A and 5B. In FIG. 6A, an end view of two rows of wirebonds 51 are shown; and for clarity, side views of wirebonds between the two rows are not shown. FIG. 6B shows an example of such a side view of the wirebonds 51. In both views, a conductive layer 71 formed on the upper surface of an overmold structure 59 is shown to include the silver-flake based conductive layer 103 (and 104) described in reference to FIGS. 4 and 5. Silver flakes are depicted as overlapping with each other to form a conductive sheet that covers substantially the entire painted surface.

In the examples shown, two layers of silver flakes are shown to depict such an overlapping concept. It will be understood, however, that there can be more or less than two layers of silver flakes in a conductive layer. Further, even though the silver flakes are depicted as being spaced generally evenly, it will be understood that such is not a requirement. In some embodiments, the flakes can be arranged evenly, randomly, or in any combination thereon.

In some embodiments, a conductive layer formed from silver flakes does not necessarily need to form a solid layer. There may be areas in the painted conductive layer where silver flakes may not exist (e.g. at a microscopic level). If such areas have sufficiently small dimensions, RF signals or noises can be effectively shielded.

Figure 6C:
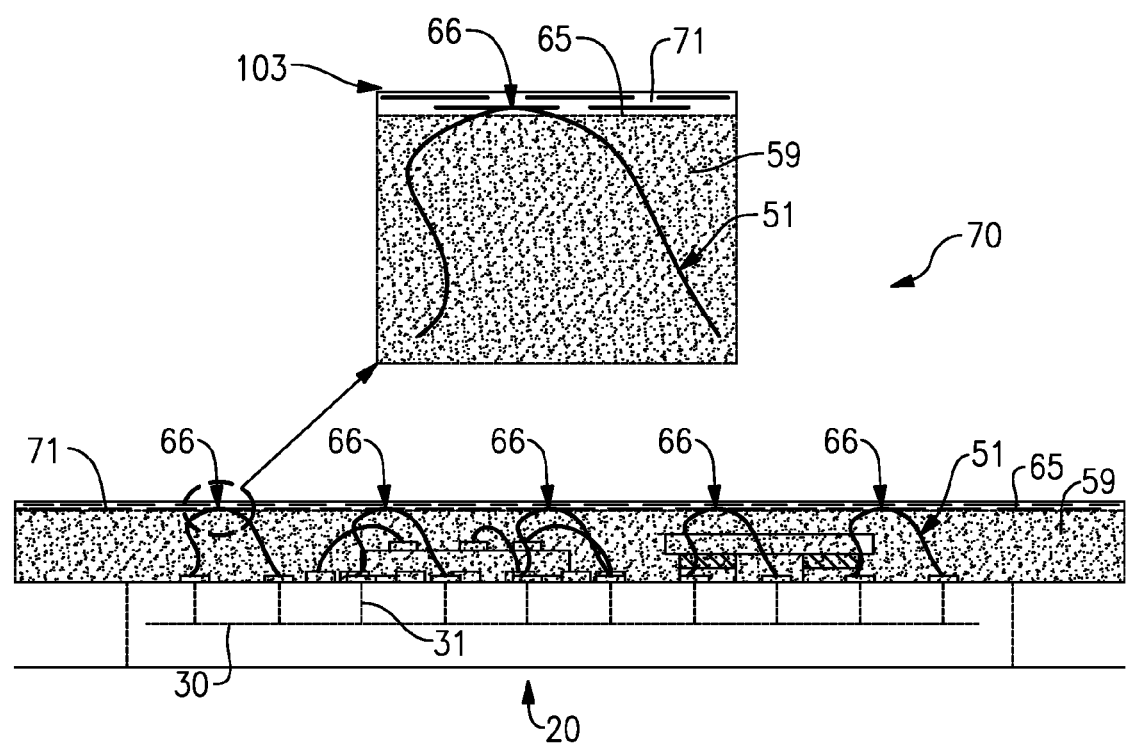

FIG. 6C shows a closer view of the conductive layer 71 that includes the silver-flake based conductive layer 103. As described herein, an upper portion 66 of a given RF-shielding wirebond 51 can be exposed by forming a surface 65 of the overmold structure 59. Such an upper portion can form an electrical contact with one or more silver flakes as shown so as to electrically connect the given wirebond 51 with the silver-flake based conductive layer 103. In some embodiments, the conductive layer 71 can have an average thickness in a range of 1 to 100 microns, 10 to 75 microns, 15 to 50 microns, or 20 to 30 microns. In some embodiments, the conductive layer 71 can have an average thickness of about 25 microns.

In some implementations, parameters such as silver flake size and/or concentration of such flakes in paint solution can be adjusted to achieve advantages in both painting process and the end results. For example, in the context of the painting process, one or more features of a conductive paint described herein can be adjusted to improve or optimize cost effectiveness and/or reliability of processes associated with spray-painting of the conductive paint. In the context of the resulting conductive paint layer, one or more features of a conductive paint can be adjusted to yield, for example, desired paint adhesion property, drying property, and consistency in thickness and silver flake concentration in the dried paint layer. In some embodiments, such thickness and/or metal concentration can be based on, for example, RF shielding requirements for a given application.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:
a packaging substrate;
a ground plane disposed below a first surface of the packaging substrate;
a plurality of shielding components disposed relative to one or more radio-frequency components mounted on the first surface, the shielding components electrically connected to the ground plane;
an overmold structure formed over the surface and dimensioned to substantially encapsulate the one or more radio-frequency components and the shielding components; and
a conductive paint layer disposed on an upper surface of the overmold structure so that the conductive paint layer, the shielding components, and the ground plane are electrically connected to provide radio-frequency shielding for a region associated with the one or more radio-frequency components, the conductive paint layer including a mixture of one or more silver flakes chosen from the group consisting of elemental silver, silver oxide, silver thiocyanate, silver cyanide, silver cyanate, silver carbonate, silver nitrate, silver nitrite, silver sulfate, silver phosphate, silver perchlorate, silver tetrafluoro borate, silver acetylacetonate, silver acetate, silver lactate, and silver oxalate, and an organic solvent that includes acetone and does not dissolve the silver flakes.

2. The module of claim 1 wherein the solvent includes one or more substances chosen from the group consisting of isopropylacetone, methyl ethyl ketone, cyclohexanone, a ketonic solvent, dimethyl carbonate, propylene carbonate, an ester solvent, 1-methoxy-2-propanol acetate, methyl acetate, ethyl acetate, propyl acetate, butyl acetate, isobutyl acetate, xylene, toluene, anisole, an aromatic solvent, n-propanol, isopropanol, n-butanol, polyalkylene glycol, ethylene glycol, monomethyl ether (methyl cellosolve), diethylene glycol, diethylene glycol monoethyl ether, diethylene glycol monobutyl ether, diethylene glycol dimethyl ether, ethyleneglycol monoethylether (ethyl cellosolve), triethylene glycol monomethyl ether, a polyoxyalkylene glycol derivative, polyoxyethylene(10)octylphenyl ether, and an ethereal solvent.

3. The module of claim 1 wherein the conductive paint layer is substantially free of a methyl ethyl ketone or derivatives thereof.

4. The module of claim 1 wherein the conductive paint layer has a thickness in a range of about 15 to 50 microns.

5. The module of claim 4 wherein the conductive paint layer has a thickness of about 25 microns.

6. The module of claim 1 wherein the conductive paint layer includes a one-part paint.

7. The module of claim 1 wherein the silver flakes have an average dimension in a range of about 20 to 30 microns.

8. The module of claim 7 wherein the silver flakes have an average dimension of about 27 microns.

9. The module of claim 1 wherein the silver flakes are overlapped so that the conductive paint layer forms an electrically conductive layer.

10. The module of claim 9 wherein the silver flakes are round-shaped or have a plurality of edge features.

11. The module of claim 1 wherein the plurality of shielding components includes a plurality of shielding wirebonds.

12. The module of claim 11 wherein the plurality of shielding wirebonds are arranged along a perimeter around the one or more radio-frequency components.

13. The module of claim 11 wherein the upper surface of the overmold structure that exposes upper portions of the plurality of shielding wirebonds.

14. A method for fabricating a radio-frequency module, the method comprising:
providing a packaging substrate including a ground plane disposed below a first surface of the packaging substrate;
forming or providing a plurality of shielding components relative to one or more radio-frequency components mounted on the first surface;
forming an overmold structure to substantially encapsulate the one or more radio-frequency components and the shielding components; and
forming a conductive paint layer on an upper surface of the overmold structure so that the conductive paint layer, the shielding components, and the ground plane are electrically connected to provide radio-frequency shielding for a region associated with the one or more radio-frequency components, the conductive paint layer including a mixture of one or more silver flakes chosen from the group consisting of elemental silver, silver oxide, silver thiocyanate, silver cyanide, silver cyanate, silver carbonate, silver nitrate, silver nitrite, silver sulfate, silver phosphate, silver perchlorate, silver tetrafluoro borate, silver acetylacetonate, silver acetate, silver lactate, and silver oxalate, and an organic solvent that includes acetone and does not dissolve the silver flakes.

15. The method of claim 14 wherein the conductive paint layer is formed at or near room temperature and without irradiation.

16. The method of claim 15 wherein the conductive paint is a one-part paint.

17. The method of claim 14 wherein forming the conductive paint layer includes spraying a conductive paint.

18. The method of claim 17 wherein the spraying is performed using a spray pressure of about 2 psi.

19. A radio-frequency device comprising:
a transceiver;
an antenna in communication with the transceiver and configured to facilitate transmission of an amplified radio-frequency signal and reception of a received signal; and
a radio-frequency module interconnected to the transceiver and the antenna to facilitate the transmission of the amplified radio-frequency signal or the reception of the received signal, the radio-frequency module including a shielded region defined by a plurality of shielding components that electrically connect a conductive paint layer and a ground plane, the conductive paint layer including a mixture of one or more silver flakes chosen from the group consisting of elemental silver, silver oxide, silver thiocyanate, silver cyanide, silver cyanate, silver carbonate, silver nitrate, silver nitrite, silver sulfate, silver phosphate, silver perchlorate, silver tetrafluoro borate, silver acetylacetonate, silver acetate, silver lactate, and silver oxalate, and an organic solvent that includes acetone and does not dissolve the silver flakes.

20. The RF device of claim 19 wherein the radio-frequency device is a wireless device.

* * * * *